United States Patent
Nonaka et al.

(10) Patent No.: US 10,719,013 B2
(45) Date of Patent: Jul. 21, 2020

(54) COMPOSITION FOR BLACK MATRIX AND METHOD FOR PRODUCING BLACK MATRIX USING THE SAME

(71) Applicant: AZ Electronic Materials (Luxembourg) S.a.r.l., Luxembourg (LU)

(72) Inventors: Toshiaki Nonaka, Tokyo (JP); Atsuko Noya, Kakegawa (JP)

(73) Assignee: AZ Electronic Materials (Luxembourg) S.a.r.l., Luxembourg (LU)

( * ) Notice: Subject to any disclaimer, the term of this patent is extended or adjusted under 35 U.S.C. 154(b) by 0 days.

(21) Appl. No.: 16/325,937

(22) PCT Filed: Aug. 16, 2017

(86) PCT No.: PCT/EP2017/070708
§ 371 (c)(1),
(2) Date: Feb. 15, 2019

(87) PCT Pub. No.: WO2018/033552
PCT Pub. Date: Feb. 22, 2018

(65) Prior Publication Data
US 2019/0204734 A1    Jul. 4, 2019

(30) Foreign Application Priority Data
Aug. 19, 2016 (JP) .................. 2016-161164

(51) Int. Cl.
| | | |
|---|---|---|
| G02B 5/20 | (2006.01) | |
| G02F 1/1335 | (2006.01) | |
| G03F 7/00 | (2006.01) | |
| C09D 183/04 | (2006.01) | |
| C08L 83/04 | (2006.01) | |
| C08G 77/18 | (2006.01) | |
| C08G 77/26 | (2006.01) | |
| C08K 3/04 | (2006.01) | |
| C08G 77/16 | (2006.01) | |
| C08G 77/00 | (2006.01) | |

(52) U.S. Cl.
CPC ........... *G03F 7/0007* (2013.01); *C08G 77/18* (2013.01); *C08G 77/26* (2013.01); *C08K 3/04* (2013.01); *C08L 83/04* (2013.01); *C09D 183/04* (2013.01); *C08G 77/16* (2013.01); *C08G 77/70* (2013.01); *C08G 77/80* (2013.01); *C08G 2150/00* (2013.01); *G02F 1/133512* (2013.01)

(58) Field of Classification Search
CPC ....... G03F 7/0007; G02B 5/201; C08G 77/26; C08G 77/80; C08G 77/18; C08G 77/70; C09D 183/04; C09L 83/04; G02F 1/133512
USPC ............................................... 430/7; 349/110
See application file for complete search history.

(56) References Cited

U.S. PATENT DOCUMENTS

| | | | |
|---|---|---|---|
| 6,407,782 B1 | 6/2002 | Kim | |
| 2007/0185262 A1 | 8/2007 | Sakamoto | |
| 2015/0219972 A1 | 8/2015 | Yang et al. | |
| 2017/0285477 A1* | 10/2017 | Tanigaki | C08K 3/36 |
| 2018/0181002 A1* | 6/2018 | Shiota | G03F 7/11 |
| 2019/0072851 A1* | 3/2019 | Tanigaki | G03F 7/032 |

FOREIGN PATENT DOCUMENTS

| | | |
|---|---|---|
| EP | 1164435 A1 | 12/2001 |
| JP | H0873800 A | 3/1996 |
| JP | H10204321 A | 8/1998 |
| JP | 2007211062 A | 8/2007 |
| WO | WO-2004092437 A2 | 10/2004 |

OTHER PUBLICATIONS

International Search Report for PCT/EP2017/070708 dated Sep. 21, 2017.
Written Opinion of the International Searching Authority for PCT/EP2017/070708 dated Sep. 21, 2017.

* cited by examiner

Primary Examiner — John A McPherson
(74) Attorney, Agent, or Firm — Faegre Drinker Biddle & Reath LLP

(57) ABSTRACT

[Problem] To provide a material, which is a composition for a black matrix, and which is suitable for a display device structure having high luminance and suitable for producing a black matrix having high heat resistance and high light shielding properties.
[Means for Solution] To use a composition for a black matrix comprising (I) a siloxane polymer having specific repeating unit(s), (II) a silanol condensation catalyst, (III) a black colorant, and (IV) a solvent.

23 Claims, No Drawings

COMPOSITION FOR BLACK MATRIX AND METHOD FOR PRODUCING BLACK MATRIX USING THE SAME

CROSS-REFERENCE TO RELATED APPLICATIONS

This application is a national stage application (under 35 U.S.C. § 371) of PCT/EP2017/070708, filed Aug. 16, 2017, which claims benefit of Japanese Application No. 2016-161164, filed Aug. 19, 2016, both of which are incorporated herein by reference in their entirety.

BACKGROUND OF THE INVENTION

Technical Field

The present invention relates to a composition for a black matrix. The present invention also relates to a method for producing a black matrix using the composition for a black matrix.

Background Art

As a black matrix for a color filter used for a color display device, a black matrix prepared by dispersing a light shielding black pigment such as carbon black in a high molecular polymer such as acrylic resin, epoxy resin, polyimide resin or the like using a dispersant to prepare a liquid composition, and by applying, curing and patterning the resulting composition has been usually used. A black matrix is used, for example, in a liquid crystal display device, to prevent light leakage between pixels which do not carry out switching and to maintain high contrast. In addition, leakage current due to photo-excitation occurs when an amorphous silicon or an oxide semiconductor is exposed to light, so leakage current is suppressed by shielding the thin film transistor portion with a black matrix layer.

Usually, the black matrix is formed on a color filter substrate side in a liquid crystal panel. A color filter prepared by dispersing a coloring pigment or dye in a transparent organic polymer such as acrylic resin, epoxy resin, polyimide resin or the like to prepare a liquid composition, and by applying, curing and patterning the resulting composition, has been used. Regarding the patterning, methods by means of lithography using a resist and by means of a photosensitive colorant has been generally used, but methods for directly forming color filter pattern, such as printing method and ink jet have been also conducted. In the process of forming such a color filter substrate, the temperature at which the transparent organic polymer of the color filter is thermally cured or the process temperature of the transparent conductive film (ITO) is the highest. That is about 200° C. Therefore, the demand for heat resistance to the black matrix was not so high. In recent years, thin film transistors having high mobility such as oxide semiconductors have been attracting attention due to the demand of high functionalization (high definition, high luminance, high contrast etc.) of the display. In addition, a method for highly functionalizing a panel by a structure in which a black matrix is formed not on a color filter substrate but on a thin film transistor side has been proposed (see Patent Document 1). Particularly, in accordance with resolution enhancement of the mobile display, a problem that the display pixel areas become smaller has been becoming apparent. Factors limiting the display pixel areas include wiring, thin film transistor and auxiliary capacitance, and a black matrix covering them, or the like.

In addition, the display pixel area is further limited due to the redundant design that is needed to bond an array substrate on which transistors are formed and a color filter substrate on which a black matrix is formed. In order to cope with such a problem, a method for providing a substrate for a display device having high transmittance, which comprises forming a black matrix on an array side substrate, thereafter planarizing with a transparent material such as BCB (registered trademark, manufactured by The Dow Chemical Company), and forming a thin film transistor thereon, has been proposed (see Patent Document 2).

As the composition for a black matrix, various proposals have been made. For example, a carbon black dispersion that achieves both high OD value and high electrical insulation using a dispersion containing carbon black having a primary particle size of 20 to 30 nm and a specific organic compound (see Patent Document 3), and also improvement of the light shielding properties by mixing a conductive carbon black with a titanium oxide pigment (see Patent Document 4) have been proposed. However, the heat resistance of organic polymer is not sufficient, and a problem remains particularly in the deposition process at high-temperature vacuum, which is performed in the process of forming a thin film transistor.

Further, a colored silica-based film forming composition comprising a specific siloxane polymer and a colorant has been proposed (see Patent Document 5). While the siloxane polymer is an organic polymer excellent in heat resistance, such an invention does not intend to improve heat resistance, but it shows improvement in dispersibility of a colorant.

PRIOR ART DOCUMENTS

Patent Documents

[Patent document 1] U.S. Unexamined Patent Application Publication No. 2015/0219972
[Patent Document 2] U.S. Pat. No. 6,407,782
[Patent Document 3] JP-A H8-73800
[Patent Document 4] JP-A H10-204321
[Patent Document 5] JP-A 2007-211062

SUMMARY OF THE INVENTION

Problems to be Solved by the Invention

When a black matrix is formed on an array side substrate, a black matrix material having high heat resistance is required. Here, in general, carbon black having high light shielding properties is widely used as a black pigment in a composition for a black matrix, but carbon black has high conductivity, and therefore, in order to suppress conductivity, a dispersant based on an organic material is used. Since such a dispersant based on an organic material has low heat resistance, a problem may cause, which is that the light shielding properties and insulating properties of the black matrix itself deteriorate due to thermal decomposition of the dispersant.

In addition to the thermal stability of dispersant, the thermal stability of binder polymer is also an important factor for improving the heat resistance of black matrix. As polymer materials for binder, acrylic resin, epoxy resin, and further polyimide resin as a heat resistant resin have been proposed. When a black matrix is formed on a color filter substrate, thermal decomposition and outgassing do not particularly become a problem due to the low process temperature. However, when a thin film transistor is formed on a black matrix, processing is performed by CVD (Chemical Vapor Deposition) under the conditions of high temperature and vacuum, so that thermal decomposition and outgas may become a problem in the CVD process even in a minute amount. Siloxane polymer is polymer excellent in transparency and heat resistance, and it has been found effective in preventing thermal decomposition of the dispersant for a black pigment and suppressing outgas, through using the siloxane polymer as a binder resin of a black matrix composition.

The present invention has been made based on the above-mentioned circumstances, and it is an object of the present invention to provide a composition for a black matrix, which is suitable for a high-luminance display device structure and also suitable for manufacturing a black matrix having high heat resistance and high light shielding properties. Furthermore, the present invention enables high light shielding properties and resistance to high temperature, and can be adapted to a device manufacturing process in high temperature process.

Here, the present inventors obtained an unexpected knowledge that a black matrix having heat resistance can be formed using a composition for a black matrix comprising a siloxane polymer having a crosslinkable silanol, a black colorant, a silanol condensation catalyst, and a solvent. The present invention has been made based on this knowledge.

Means for Solving the Problems

The composition for a black matrix according to the present invention (hereinafter, sometimes referred to as composition for simplicity) comprising
(I) a siloxane polymer having a repeating unit represented by the following general formulae (Ia) and/or (Ib):

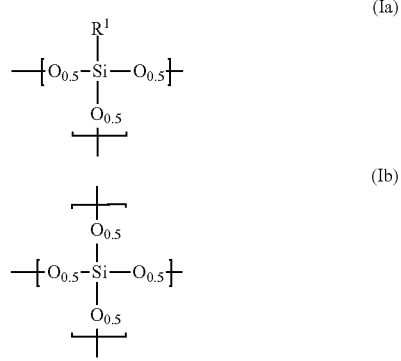

wherein,
$R^1$ represents hydrogen, a monovalent to trivalent, linear, branched or cyclic, saturated or unsaturated $C_{1-30}$ aliphatic hydrocarbyl, or a monovalent to trivalent $C_{6-30}$ aromatic hydrocarbyl,
in said aliphatic hydrocarbyl and said aromatic hydrocarbyl, one or more methylenes are substituted by oxy, imide or carbonyl, or unsubstituted; one or more hydrogens are substituted by fluorine, hydroxy or alkoxy, or unsubstituted; or one or more carbons are substituted by silicon, or unsubstituted,
when $R^1$ is divalent or trivalent, $R^1$ connects silicons contained in a plurality of repeating units,
here, the ratio x in all the repeating units of the general formula (Ia) is 50 mol % to 100 mol %, and the ratio y in all the repeating units of the general formula (Ib) is 0 mol % to 50 mol %, (II) a silanol condensation catalyst,
(III) a black colorant, and
(IV) a solvent.

The method for producing a black matrix according to the present invention is characterized by comprising applying the above composition for a black matrix to form a coating film and curing said coating film.

Effects of the Invention

According to the present invention, it is possible to provide a composition suitable for manufacturing a black matrix, which is suitable for a high luminance display device structure and having high heat resistance and high light shielding properties. By enhancing heat resistance, it becomes possible to form the black matrix, which has conventionally been formed on a color filter substrate, on a thin film transistor array substrate. This makes it possible to reduce the necessity of redundant design for a black matrix, which has conventionally been conducted to secure the margin for bonding a color filter substrate to a thin film transistor array substrate. Furthermore, a problem that a screen becomes dark due to decrease of the display area of liquid crystal or organic electroluminescence (OLED), which has been a problem in high definition panel design, can be solved and the increase in power consumption can also be suppressed.

In addition, the present invention can be used also as a composition for a black matrix with photosensitivity by containing a photobase generator or a photoacid generator.

DETAILED DESCRIPTION OF THE INVENTION

Mode for Carrying Out the Invention

Embodiments of the present invention are described below in detail. In the present specification, when numerical ranges are indicated using "-", unless specifically referred, they include both endpoints and the unit is in common. For example, 5-25 mol % means 5 mol % or more and 25 mol % or less.

In the present specification, such a description as "$C_{x-y}$", "$C_x$-$C_y$" and "$C_x$" means the number of carbon in a molecule or substituent. For example, $C_{1-6}$ alkyl means alkyl having from 1 or more and 6 or less carbons (methyl, ethyl, propyl, butyl, pentyl, hexyl etc.). Further, the fluoroalkyl as used in the present specification refers to one in which one or more hydrogens in alkyl are replaced with fluorine, and the fluoroaryl refers to one in which one or more hydrogens in aryl are replaced with fluorine.

In the present specification, unless specifically referred, the alkyl means linear or branched alkyl, and the cycloalkyl means alkyl containing a cyclic structure. A cyclic structure substituted with a linear or branched alkyl is also referred to as cycloalkyl. Further, the hydrocarbyl (hydrocarbon group) means a monovalent, divalent or more valent group containing carbon and hydrogen, and optionally containing oxygen or nitrogen. And, the aliphatic hydrocarbyl means a linear, branched or cyclic aliphatic hydrocarbyl, and the aromatic hydrocarbyl contains an aromatic ring and optionally has an aliphatic hydrocarbyl as a substituent. These aliphatic hydrocarbyl and aromatic hydrocarbyl optionally contain fluorine, oxy, hydroxy, amino, carbonyl, or silyl etc.

In the present specification, when polymer has plural types of repeating units, these repeating units copolymerize. Unless specifically referred, these copolymerization may be any of alternating copolymerization, random copolymerization, block copolymerization, graft copolymerization, or a mixture thereof.

In the present specification, unless specifically referred, Celsius is used as the unit of temperature. For example, 20 degrees means 20 degrees Celsius.

[Composition for a Black Matrix]

The composition according to the invention comprises (I) a specific siloxane polymer, (II) a silanol condensation catalyst, (III) a black colorant, and (IV) a solvent.

Each component contained in the composition according to the present invention are described below in detail.

(I) Siloxane Polymer

The siloxane polymer refers to polymer having a Si—O—Si bond (siloxane bond) as a main chain. Depending on the number of oxygen bonded to a silicon, the skeleton structure of the siloxane polymer can be classified as follows: a silicone skeleton (the number of oxygen bonded to a silicon is 2), a silsesquioxane skeleton (the number of oxygen bonded to a silicon is 3), and a silica skeleton (the number of oxygen bonded to a silicon is 4). When the silicone structure is numerous, the polymer structure tends to be easily broken at high temperature. In the present invention, these skeleton structure of the siloxane polymer is primarily composed of a silsesquioxane skeleton and may be a combination of plural types. In particular, in the case of heating and curing, a silsesquioxane structure or a mixture of a silsesquioxane structure and a silica structure is preferred in order to accelerate the curing reaction upon forming the coating film and to increase the strength of the cured film.

The siloxane polymer according to the present invention has a repeating unit represented by the following general formulae (Ia) and/or (Ib):

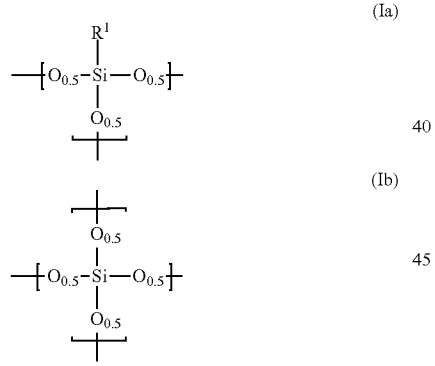

wherein, $R^1$ represents hydrogen, a monovalent to trivalent, linear, branched or cyclic, saturated or unsaturated $C_{1-30}$ aliphatic hydrocarbyl, or a monovalent to trivalent $C_{6-30}$ aromatic hydrocarbyl, in said aliphatic hydrocarbyl and said aromatic hydrocarbyl, one or more methylenes are substituted by oxy, imide or carbonyl, or unsubstituted; one or more hydrogens are substituted by fluorine, hydroxy or alkoxy, or unsubstituted; or one or more carbons are substituted by silicon, or unsubstituted, when $R^1$ is divalent or trivalent, $R^1$ connects silicons contained in a plurality of repeating units, here, the ratio x in all the repeating units of the general formula (Ia) is 50 mol % to 100 mol %, and the ratio y in all the repeating units of the general formula (Ib) is 0 mol % to 50 mol %.

Specific examples of preferable $R_1$ include methyl, ethyl, n-propyl, isopropyl, n-butyl, t-butyl and n-pentyl, phenyl and naphthyl. In particular, a structure containing a phenyl is preferred from the viewpoint of improvement in solubility in a solvent and improvement in crack resistance.

x is preferably 50 mol % or more and 95 mol % or less, more preferably 80 mol % or more and 90 mol % or less. From the viewpoint of easy synthesis, y is preferably 30 mol % or less, more preferably 5 mol % or more and 20 mol % or less.

In the present invention, the structure of siloxane polymer preferably has a nonlinear structure by containing repeating units of the general formulae (Ia) and/or (Ib). That is, units of the general formulae (Ia) and/or (Ib) may be bonded to each other to form a cyclic structure or a network structure. In the present invention, the siloxane polymer preferably comprises a cyclic structure in which the repeating units of the general formulae (Ia) and/or (Ib) are ring-closed in the form of trimer to hexamer. Also preferred is a structure in which a plurality of the above cyclic structure are contained and the cyclic structures are bonded to each other by each unit of the general formula (Ia) or (Ib). Examples of preferable structures are described below.

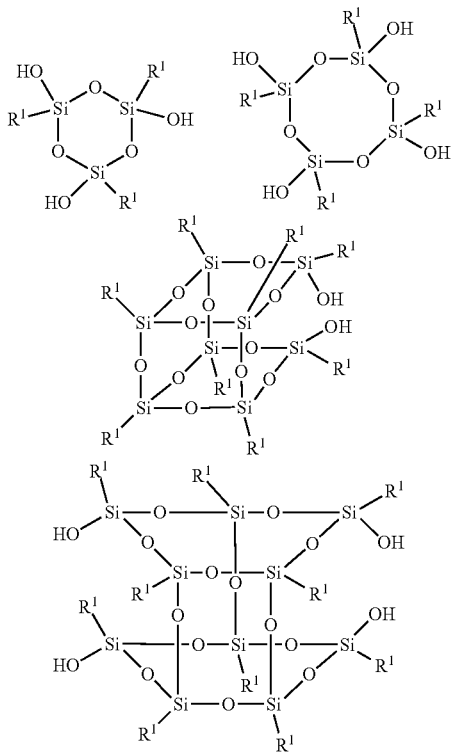

In addition, the terminal groups of these siloxane polymer are not particularly limited. When the repeating units are bonded to each other to form a cyclic structure, there are cases where no specific terminal group is present. Further, the terminal group may be —$O_{0.5}$H or —$O_{0.5}R^1$ ($R^1$ is as defined above) derived from a hydroxyl or alkoxy. If necessary, a siloxane polymer having a linear structure may be used in combination. However, in applications requiring high temperature resistance, the siloxane polymer having a linear structure is preferably 30 mol % or less of the total siloxane polymer.

The mass average molecular weight of the siloxane polymer is usually 200 or more and 15,000 or less, for example 200 or more and 10,000 or less, or 500 or more and 15,000 or less. It is preferably 1,000 or more and 10,000 or less, more preferably 1,000 or more and 5,000 or less, from the viewpoint of solubility in an organic solvent and solubility in an alkali developing solution. Here, the mass average molecular weight is the mass average molecular weight in terms of styrene by gel permeation chromatography. Further, the ratio Mw/Mn of the mass average molecular weight (Mw) to the number average molecular weight (Mn) in terms of styrene is preferably 2.5 or less, more preferably 2.0 or less.

(II) Silanol Condensation Catalyst

The composition according to the present invention comprises a silanol condensation catalyst. The silanol condensation catalyst is used for the purpose of accelerating the condensation reaction of the siloxane polymer. Specifically, it can be roughly classified into the following categories:

(i) photoacid generators which decompose upon irradiation with light to release an acid, (ii) photobase generators which decompose upon irradiation with light to release a base, (iii) thermal acid generators which decompose by heat to release an acid, and (iv) thermal base generators which decompose by heat to release a base.

Incidentally, there are thermal acid generators and thermal base generators whose thermal decomposition temperature is reduced due to structural isomerization induced by being irradiated with light, but these have been classified into (i) photoacid generators or (ii) photobase generators. These silanol condensation catalysts are selected in accordance with the condensation reaction and crosslinking reaction utilized in the process for manufacturing a cured film. Here, examples of the light include visible light, ultraviolet light, infrared light, X ray, electron beam, α ray, or γ ray etc.

The photoacid generator or photobase generator generates an acid or a base at the time of exposure, and it is considered that the generated acid or base contributes to the condensation reaction of the siloxane polymer. In the case of, for example, forming a positive pattern using the composition according to the present invention, it is general to apply the composition onto a substrate to form a coating film, to expose the film to light, to develop with an alkali developing solution, and to remove the exposed parts. Here, it is preferred that the silanol condensation catalyst generates an acid or a base not at the time of the above exposure to light (hereinafter referred to as "first exposure") but when second exposure is performed to the whole surface, and it is preferred that absorption of wavelength at the time of the first exposure is less. For example, when the first exposure is performed with g-line (peak wavelength: 436 nm) and/or h-line (peak wavelength: 405 nm) and the second exposure is performed with g+h+i-line (peak wavelength: 365 nm), it is preferred to select the photoacid generator or the photobase generator having a higher absorbance at a wavelength of 365 nm than that at a wavelength of 436 nm and/or 405 nm. Specifically, the ratio of the absorbance at a wavelength of 365 nm/the absorbance at a wavelength of 436 nm or of the absorbance at a wavelength of 365 nm/the absorbance at a wavelength of 405 nm is preferably 5/1 or more, more preferably 10/1 or more, further preferably 100/1 or more.

In addition, the thermal acid generator or thermal base generator generates an acid or a base at the time of post-baking. It is considered that the acid or base generated by light or heat contributes to the condensation reaction of the siloxane polymer during the post-baking.

Although the optimum amount of the compound to be added depends on the kind and the amount of the active substance generated by decomposition, and the required sensitivity or dissolution contrast between the exposed part and the unexposed part, it is preferably 0.1 to 10 parts by mass, more preferably 0.5 to 3 parts by mass, based on 100 parts by mass of the total siloxane polymer. When the addition amount is less than 0.1 parts by mass, the amount of acid or base to be generated is too small, so that the condensation reaction is not accelerated during the post-baking, and pattern flow tends to occur easily. On the other hand, when the addition amount is more than 10 parts by mass, cracks may be generated in the formed coating film. In addition, the increased addition amount may cause degradation of electrical insulation of the cured product and outgas due to thermal decomposition, and this therefore may become a problem in the post process.

Said photoacid generator may be arbitrarily selected from commonly used ones, and examples thereof include diazomethane compounds, triazine compounds, sulfonic acid esters, diphenyliodonium salts, triphenylsulfonium salts, sulfonium salts, ammonium salts, phosphonium salts, sulfonimide compounds, and the like.

As well as those described above, examples of specific usable photoacid generator include 4-methoxyphenyldiphenylsulfonium hexafluorophosphonate, 4-methoxyphenyldiphenylsulfonium hexafluoroarsenate, 4-methoxyphenyldiphenylsulfonium methanesulfonate, 4-methoxyphenyldiphenylsulfonium trifluoroacetate, triphenylsulfonium tetrafluoroborate, triphenylsulfonium tetrakis(pentafluorophenyl)borate, triphenyl sulfonium hexafluorophosphonate, triphenylsulfonium hexafluoroarsenate, 4-methoxyphenyldiphenylsulfonium p-toluenesulfonate, 4-phenylthiophenyldiphenyltetrafluoroborate, 4-phenylthiophenyldiphenylhexafluorophosphonate, triphenylsulfonium methanesulfonate, triphenylsulfonium trifluoroacetate, triphenylsulfonium p-toluenesulfonate, 4-methoxyphenyldiphenylsulfonium tetrafluoroborate, 4-phenylthiophenyldiphenylhexafluoroarsenate, 4-phenylthiophenyldiphenyl-p-toluenesulfonate, N-(trifluoromethylsulfonyloxy)succinimide, N-(trifluoromethylsulfonyloxy)phthalimide, 5-norbornene-2,3-dicarboximidyltriflate, 5-norbornene-2,3-dicarboximidyl-p-toluenesulfonate, 4-phenylthiophenyldiphenyltrifluoromethanesulfonate, 4-phenylthiophenyldiphenyltrifluoroacetate, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)naphthylimide, N-(nonafluorobutylsulfonyloxy)naphthylimide and the like.

Further, following ones have absorption in the wavelength region of h-line, and use thereof should be avoided unless it is intended to let have absorption of h-line: 5-propylsulfonyloxyimino-5H-thiophen-2-ylidene-(2-methylphenyl)acetonitrile, 5-octylsulfonyloxyimino-5H-thiophene-2-ylidene-(2-methylphenyl)acetonitrile, 5-camphorsulfonyloxyimino-5H-thiophene-2-ylidene-(2-methylphenyl)acetonitrile, 5-methylphenylsulfonyloxyimino-5H-thiophene-2-ylidene-(2-methylphenyl)acetonitrile, and the like.

Examples of said photobase generator include a polysubstituted amide compound having an amide, and a lactam or imide compound, or a compound containing a structure thereof.

Further, preferable examples of the photobase generator include a photobase generator represented by the following general formula (IIa), more preferably a hydrate or a solvate thereof.

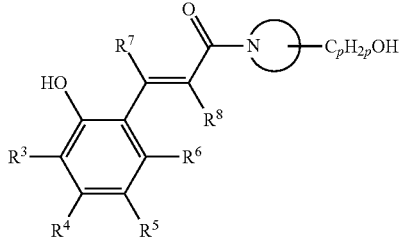

(IIa)

wherein, p is an integer of 1 to 6;

$R^3$ to $R^8$ are each independently hydrogen, halogen, hydroxyl, mercapto, sulfide, silyl, silanol, nitro, nitroso, sulfino, sulfo, sulfonate, phosphino, phosphinyl, phosphono, phosphonate, amino, ammonium, $C_{1-20}$ aliphatic hydrocarbyl, which may contain a substituent, $C_{6-22}$ aromatic hydrocarbyl, which may contain a substituent, $C_{1-20}$ alkoxy, which may contain a substituent, or $C_{6-20}$ aryloxy, which may contain a substituent; and two or more of $R^3$ to $R^6$ may be bonded to form cyclic structure(s), said cyclic structure may contain hetero atom(s), N is a constituent atom of a nitrogen-containing heterocyclic ring, said nitrogen-containing heterocyclic ring is a 3- to 10-membered ring, and said nitrogen-containing heterocyclic ring may further have $C_{1-20}$ aliphatic hydrocarbyl, which are different from $C_pH_{2p}OH$ group and may contain substituent(s).

It is preferred that $R^3$ to $R^6$ are selected appropriately according to the exposure wavelength to be used. For display applications, for example, unsaturated hydrocarbon bonding functional groups such as a vinyl and an alkynyl, which shift the absorption wavelength to g-, h-, i-lines, as well as an alkoxy, a nitro and the like are used, and a methoxy and an ethoxy are particularly preferable.

Specific examples of the compound represented by the formula (IIa) include the following.

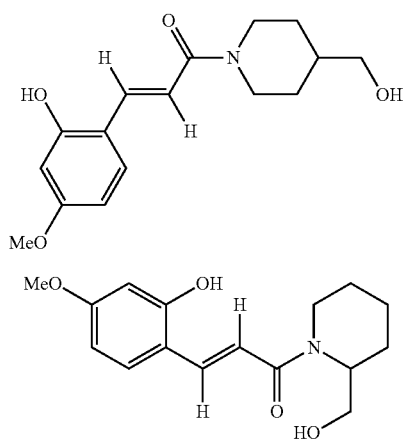

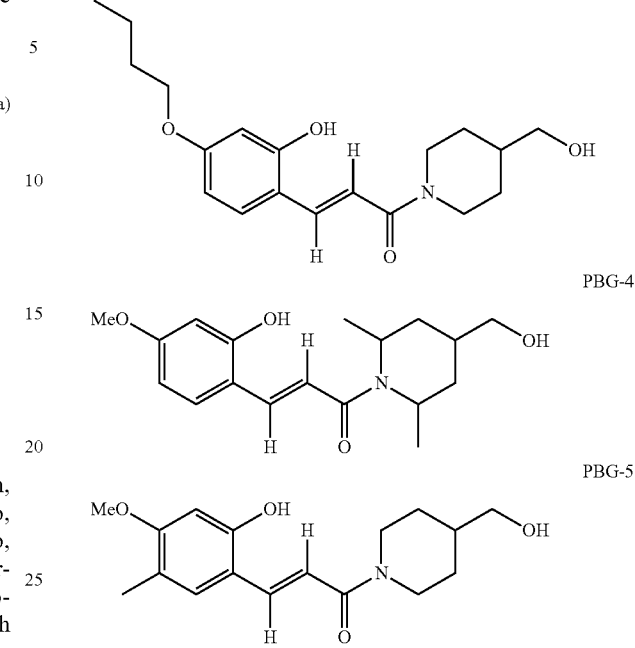

Examples of said thermal acid generator include salts or esters, which generate an organic acid, such as various aliphatic sulfonic acids and salts thereof; various aliphatic carboxylic acids and salts thereof, such as citric acid, acetic acid, maleic acid and the like; various aromatic carboxylic acids and salts thereof, such as benzoic acid and phthalic acid; aromatic sulfonic acids and ammonium salts thereof; various amine salts; aromatic diazonium salts; and phosphonic acids and salts thereof. Among the thermal acid generators to be used in the present invention, a salt composed of an organic acid and an organic base is particularly preferable, and a salt composed of a sulfonic acid and an organic base is further preferable.

Preferred sulfonic acids include p-toluenesulfonic acid, benzenesulfonic acid, p-dodecylbenzenesulfonic acid, 1,4-naphthalenedisulfonic acid, methanesulfonic acid, and the like. These acid generators can be used singly or as a mixture thereof.

Examples of said thermal base generator include compounds which generate a base, such as imidazole, tertiary amine, quaternary ammonium, and mixtures thereof. Examples of the base to be released include imidazole derivatives, such as N-(2-nitrobenzyl-oxycarbonyl)imidazole, N-(3-nitrobenzyloxycarbonyl)-imidazole, N-(4-nitrobenzyloxycarbonyl)imidazole, N-(5-methyl-2-nitrobenzyloxycarbonyl)imidazole and N-(4-chloro-2-nitrobenzyloxycarbonyl)imidazole; and 1,8-di-azabicyclo(5,4,0)undecene-7, and the like. Similarly to the acid generators, these base generators can be used singly or as a mixture thereof.

In the case where the silanol condensation catalyst is an acid generator, either boiling point of, decomposition temperature of or sublimation temperature of the generated acid is preferably 300° C. or lower. It is more preferable that any acid does not remain in the film as the result of post-baking. This is because while the acid is a condensation catalyst for silanol, particularly when a strong acid is present at a high temperature, decomposition of the siloxane group and cleavage of the Si—C bond are promoted. As the result, when the siloxane cured product is exposed to a high temperature in the CVD or heating process in the condition that a strong acid remains therein, low molecular weight siloxane sublimate, organic substance and the like are concerned about as outgas.

(III) Black Colorant

As the black colorant, various known inorganic and organic colorants can be used, but from the viewpoint of enhancing heat resistance, it is preferred to use an inorganic black colorant. Examples of such a black colorant include carbon black, titanium based black pigment, iron oxide pigment and composite metal oxide pigment etc. Examples of the carbon black include furnace black, channel black, acetylene black, thermal black and lamp black etc. Examples of commercially available black colorant comprising carbon black include TSBK-007 (trade name, manufactured by Taisei Kako Co., Ltd.). The titanium based black pigment is primarily composed of lower titanium oxide, titanium oxynitride or the like, and examples of commercially available titanium based black pigment include Titan Black (trade name, Mitsubishi Material Electronic Chemicals Co., Ltd.) and the like. The iron oxide pigment is primarily composed of black iron oxide ($Fe_3O_4$) called magnetite. The composite metal oxide pigment is an inorganic pigment which is composed of a solid solution of a plurality of metal oxides and includes Cu, Fe, Mn, Cr, Co, V and Ni etc. Examples of the black composite metal oxide pigment include Fe—Cr based pigment, Cu—Cr—Mn based pigment, Cu—Mn—Fe based pigment, Co—Fe—Cr based pigment and the like, and Black 3500 (trade name, manufactured by Asahi Kasei Kogyo Co., Ltd.) and Black #3510 (trade name, manufactured by Dainichiseika Color & Chemicals Mfg. Co., Ltd.) etc. are commercially available. Among these black colorants, carbon black is preferably used from the viewpoint of light shielding properties and low reflectivity.

The carbon black contained in the black colorant used for the present invention has a volume average particle size of preferably 1 to 300 nm, more preferably 50 to 150 nm. By setting the average particle size of the black colorant within this range, good light shielding properties can be obtained. In addition, such a volume average particle size can be measured by a device such as a Nanotrac particle size analyzer manufactured by Nikkiso Co., Ltd. based on the dynamic light scattering method (DLS: Dynamic Light Scattering).

The black colorant to be used in the present invention can be used also in combination with a dispersant. As the dispersant, for example, an organic compound based dispersant such as a polymer dispersant described in JP-A-2004-292672 may be used.

In the composition according to the present invention, the mass ratio of the black colorant to the siloxane polymer is determined by OD (optical density) required as a black matrix. Black colorant: siloxane polymer=10:90 to 70:30 is preferred.

(IV) Solvent

Examples of the solvent include ethylene glycol monoalkyl ethers, such as ethylene glycol monomethyl ether, ethylene glycol monoethyl ether, ethylene glycol monopropyl ether and ethylene glycol monobutyl ether; diethylene glycol dialkyl ethers, such as diethylene glycol dimethyl ether, diethylene glycol diethyl ether, diethylene glycol dipropyl ether and diethylene glycol dibutyl ether; ethylene glycol alkyl ether acetates, such as methyl cellosolve acetate and ethyl cellosolve acetate; propylene glycol monoalkyl ethers, such as propylene glycol monomethyl ether (PGME) and propylene glycol monoethyl ether; propylene glycol alkyl ether acetates, such as propylene glycol monomethyl ether acetate (PGMEA) and propylene glycol monopropyl ether acetate; aromatic hydrocarbons, such as benzene, toluene and xylene; ketones such as methyl ethyl ketone, acetone, methyl amyl ketone, methyl isobutyl ketone, cyclohexanone; and the like. These solvents are used singly or as a mixture of two or more kinds. The blending ratio of the solvent varies depending on the application method and the demand for film thickness after coated. For example, in the case of spray coating, the ratio becomes 90 mass % or more based on the total mass of the siloxane polymer and optional components, but in the case of slit coating of a large glass substrate to be used for manufacturing a display, it is usually 50 mass % or more, preferably 60 mass % or more, and usually 90 mass % or less, preferably 85 mass % or less.

The composition according to the present invention essentially comprises (I) to (IV) as described above, but further compounds can be combined if necessary. These materials that can be combined are described in the following. Further, the components other than (I) to (IV) in the whole composition are preferably 10% or less, more preferably 5% or less, based on the total mass.

(Optional Components)

In addition, the composition for a black matrix according to the present invention may contain other optional components as necessary. Examples of such a component include a photosensitizer and a surfactant etc.

In order to improve coatability, it is preferred to use a surfactant. Examples of the surfactant that can be used in the composition for a black matrix in the present invention include a nonionic surfactant, an anionic surfactant, an amphoteric surfactant, and the like.

Examples of the nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycol; polyethoxylate of acetylene alcohol; acetylene glycol derivatives, such as polyethoxylate of acetylene glycol; fluorine-containing surfactants, such as Fluorad (trade name, manufactured by Sumitomo 3M Limited), Megafac (trade name, manufactured by DIC Corporation), Surufuron (trade name, Asahi Glass Co., Ltd.); or organosiloxane surfactants, such as KP341 (trade name, manufactured by Shin-Etsu Chemical Co., Ltd.). Examples of said acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexane-diol and the like.

Further, examples of the anionic surfactant include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid and the like.

Further, examples of the amphoteric surfactant include 2-alkyl-N-carboxymethyl-N-hydroxyethyl imidazolium betaine, lauric acid amide propyl hydroxysulfone betaine and the like.

These surfactants can be used singly or as a mixture of two or more kinds, and the blending ratio thereof is usually 50 to 10,000 ppm, preferably 100 to 5,000 ppm, based on the total mass of the composition for a black matrix.

Further, by adding a photosensitizer to the composition for a black matrix according to the present invention, it is also possible to impart photosensitivity to the composition. By selecting the type of photosensitizer, it is possible to make the composition for a black matrix according to the present invention function as either a positive type photosensitive composition or a negative type photosensitive composition.

[Method for Producing a Black Matrix]

The black matrix according to the present invention can be formed by an arbitrary method using the above-described composition for a black matrix. Preferably, the method for producing a black matrix according to the present invention is characterized by comprising applying the composition according to the present invention onto a substrate to form a coating film, and curing the coating film.

The substrate to be used is not particularly limited, and examples of them include various substrates such as a silicon substrate, a glass plate, a metal plate, a ceramic plate and the like. In particular, an array substrate of a liquid crystal display or the like is preferable as the substrate of the present invention. The coating method is not particularly limited, and various methods such as a spin coating method, a dip coating method, a knife coating method, a roll coating method, a spray coating method, a slit coating method, and the like can be adopted. Alternatively, when coating, a desired pattern can also be printed using the composition for a black matrix.

The coating film thus formed on the substrate is pre-baked as necessary. The pre-baking temperature is adjusted depending on the type of the organic solvent contained in the composition. In general, when the temperature is too low, the residual organic solvent in the coating film becomes more, and this sometimes causes to corrade a substrate transporting apparatus or the like. On the other hand, when the temperature is too high, the coating film is suddenly dried to cause uneven coating. Therefore, the pre-baking temperature is preferably 80 to 150° C., further preferably 100 to 120° C. The pre-baking can be carried out using a heating apparatus such as a hot plate or an oven, and the pre-baking time varies depending on the type of the used organic solvent and the temperature of pre-baking, but is preferably 30 seconds to 10 minutes, further preferably 1 minute to 5 minutes.

After pre-baked as necessary, the coating film is cured. The temperature at the time of curing can be arbitrarily selected as long as it is the temperature at which the coating film is cured. However, if the temperature is too low, the reaction sometimes does not proceed sufficiently and the curing may not be sufficiently performed. Usually, in the case of forming an oxide film or a nitride film at a high temperature vacuum process (300 to 350° C.) such as CVD at the post process, it is considered that outgas can be eliminated by curing at a temperature of nearly the same as or lower than such a temperature. However, in the present invention, curing can sufficiently be performed even at about 200° C. due to the curing induced by the silanol condensation catalyst, but from the viewpoint of outgas in the later process, it is preferably 230° C. or higher. In addition, the time is not particularly limited, but it is preferably 0.5 to 2 hours. Further, although the treatment is generally carried out in the atmosphere, it can be carried out also under an inert gas atmosphere such as nitrogen, helium, argon, etc., if necessary. Further, the heating apparatus is not particularly limited, and for example, a hot plate, an oven, or the like can be used.

After curing, if necessary, the black matrix is patterned by etching. As the etching method, there are a dry etching method and a wet etching method, and the method can be arbitrarily selected according to the application. In the case where the composition for a black matrix is printed into a desired pattern at the time of coating, this etching step can be omitted. Further, when the composition for a black matrix contains a photosensitizer and has photosensitivity, a desired pattern can be obtained by irradiating light through a mask and performing development processing, instead of the etching treatment.

Since the black matrix according to the present invention has high heat resistance, even if it is formed on the array substrate side, the light shielding properties and insulating properties of the black matrix do not deteriorate per se, and good light shielding properties and insulating properties are maintained.

Further, the black matrix according to the present invention may be coated with a layer to form a black matrix composite. The layer is preferably formed by applying and curing a composition comprising a siloxane polymer having a repeating unit represented by the general formulae (Ia) and/or (Ib). The black matrix according to the present invention can be applied to, for example, a display device or the like. In such a case, it is more preferable since the level difference of the black matrix is planarized by the protective film.

EXAMPLE

Hereinafter, the present invention is described more specifically with reference to Examples and Comparative Examples, but the present invention is not limited by these Examples and Comparative Examples at all.

Synthesis Example 1 (Synthesis of Siloxane Polymer A)

107 g of methyltriethoxysilane, 96 g of phenyltriethoxysilane and 300 g of PGMEA were charged into a four-necked flask and dissolved. Then, 48 g of a 44 mass % sodium hydroxide aqueous solution was added, and the mixture was stirred at 500 rpm for 2 hours. Next, the mixture was neutralized with acetic acid aqueous solution and stirred for 1 hour. Thereafter, the reaction solution was transferred to a separatory funnel and allowed to stand for 30 minutes to separate the organic solvent phase from the aqueous phase. The aqueous phase was discarded, and 100 g of pure water was newly added to the organic solvent phase in the separating funnel and shaken. The alkaline component and water-soluble components remaining in the organic solvent phase were extracted and washed. This washing operation was performed three times. After this, the organic solvent phase washed with pure water was collected. As a result of measuring the molecular weight of the siloxane polymer A contained in the organic solvent phase, the number average molecular weight was 1,200 and the mass average molecular weight was 1,700, in terms of polystyrene.

Synthesis Example 2 (Synthesis of Siloxane Polymer B)

125 g of methyltriethoxysilane, 63 g of tetraethoxysilane and 200 g of PGME were charged into a four-necked flask and dissolved. Then, 58 g of a 69 mass % sodium hydroxide aqueous solution was added, and the mixture was stirred at 500 rpm for 2 hours. Next, the mixture was neutralized with acetic acid aqueous solution and stirred for 1 hour. Thereafter, the reaction solution was transferred to a separatory funnel and allowed to stand for 30 minutes to separate the organic solvent phase from the aqueous phase. The aqueous phase was discarded, 100 g of pure water was newly added to the organic solvent phase in the separating funnel and shaken. The alkaline component and water-soluble components remaining in the organic solvent phase were extracted and washed. This washing operation was performed three times. After this, the organic solvent phase washed with pure water was collected. As a result of measuring the molecular weight of the siloxane polymer B contained in the organic solvent phase, the number average molecular weight was 1,600 and the mass average molecular weight was 3,500, in terms of polystyrene.

Synthesis Example 3 (Synthesis of Siloxane Polymer C)

89 g of methyltriethoxysilane, 96 g of phenyltriethoxysilane, 21 g of tetraethoxysilane and 300 g of PGMEA were charged into a four-necked flask, and dissolved. Then, 54 g of a 35 mass % sodium hydroxide aqueous solution was added, and the mixture was stirred at 500 rpm for 2 hours. Next, the mixture was neutralized with acetic acid aqueous solution and stirred for 1 hour. Thereafter, the reaction solution was transferred to a separatory funnel and allowed to stand for 30 minutes to separate the organic solvent phase from the aqueous phase. The aqueous phase was discarded, 100 g of pure water was newly added to the organic solvent phase in the separating funnel and shaken. The alkaline component and water-soluble components remaining in the organic solvent phase were extracted and washed. This washing operation was performed three times. After this, the organic solvent phase washed with pure water was collected. As a result of measuring the molecular weight of the siloxane polymer C contained in the organic solvent phase, the number average molecular weight was 1,400 and the mass average molecular weight was 3,000, in terms of polystyrene.

Synthesis Example 4 (Synthesis of Siloxane Polymer D)

2 g of 35 mass % hydrochloric acid (HCl) aqueous solution, 400 ml of PGMEA, and 10.0 g of water were charged into a four-necked flask. Then, a mixture solution of 39.7 g of phenyltrimethoxysilane, 34.1 g of methyltrimethoxysilane, 30.8 g of tris-(3-trimethoxypropyl)isocyanurate, and 0.3 g of trimethoxysilane was prepared in a dropping funnel. The mixture solution was dropped into the four-necked flask at 10° C., and the mixture was stirred for 3 hours at 10° C. Then, 200 ml of toluene and 200 ml of water were added to the mixture, and the mixture was separated into two phases. The obtained organic phase was concentrated under reduced pressure to remove the solvent, and PGMEA was added to it so as to provide 40 mass % solid content concentration solution. As a result of measuring the molecular weight of the obtained siloxane polymer D, the number average molecular weight was 3,900 and the mass average molecular weight was 7,500, in terms of polystyrene.

Example 1 (Preparation of a Composition for a Black Matrix)

Siloxane polymer A and a black colorant were mixed so that their solid content mass ratio became 90:10. Here, TSBK-007 (trade name, manufactured by Taisei Kako Co., Ltd.) containing carbon black having a volume average particle size of 100 nm as a black colorant and a dispersant was used. In addition, KF-53 (trade name, manufactured by Shin-Etsu Chemical Co., Ltd.) as a surfactant in an amount of 0.1 part by mass based on 100 parts by mass of the total solid content, and 1,8-diazabicyclo(5,4,0)undecene-7-orthophthalate (trade name, San-Apro Ltd.) as a catalyst in an amount of 0.05 parts by mass were added to the mixture to prepare a PGMEA solution having a total solid content of 35%, and then a composition for a black matrix was obtained.

Formation of a Black Matrix

Using the composition for a black matrix obtained in Example 1, a black matrix having a thickness of 1.0 μm after cured was formed on a glass substrate (EAGLE XG (registered trademark), manufactured by Corning Incorporated). At that time, the composition for a black matrix was applied onto the glass substrate, pre-baked at 130° C. for 90 seconds on a hot plate, and then cured in the air at 250° C. for 1 hour.

Compositions for a black matrix of Examples 2 to 10 and Comparative Examples 1 and 2 were prepared and black matrices were formed, in the same manner as in Example 1 except that the composition was changed as shown in the following Table 1.

The surface resistivity values of the black matrices obtained above were evaluated as follows and the results were summarized in the following Table 1.

The surface resistivity was measured using a high performance resistivity meter MCP-HT800 and the surface resistivity at an applied voltage of 1,000V was evaluated by the MCC-B method. It is evaluated as having heat resistance when the surface resistivity value after pre-baking is exceeding $1.0 \times 10^{12}$ and the surface resistivity value after cured (Table 1) does not decrease.

TABLE 1

| | composition for black matrix | | | | |
| --- | --- | --- | --- | --- | --- |
| | polymer | silanol condensation catalyst | black colorant | solid content mass ratio of black colorant and polymer | Evaluation surface seisstivity (Ω/sheet) |
| Example 1 | siloxane polymer A | thermal base generator | carbon black A | 10:90 | $>1.0 \times 10^{12}$ |
| Example 2 | siloxane polymer A | thermal base generator | carbon black A | 23:77 | $>1.0 \times 10^{12}$ |
| Example 3 | siloxane polymer A | thermal base generator | carbon black A | 33:67 | $1.0 \times 10^{10}$ |
| Example 4 | siloxane polymer A | thermal base | carbon black A | 41:59 | $1.0 \times 10^{8}$ |

TABLE 1-continued

| | composition for black matrix | | | | |
|---|---|---|---|---|---|
| | polymer | silanol condensation catalyst | black colorant | solid content mass ratio of black colorant and polymer | Evaluation surface seisstivity (Ω/sheet) |
| Example 5 | siloxane polymer A | thermal acid generator | carbon black A | 23:77 | >1.0 × 10$^{12}$ |
| Example 6 | siloxane polymer A | photoacid generator | carbon black A | 23:77 | >1.0 × 10$^{12}$ |
| Example 7 | siloxane polymer A | photobase generator | carbon black A | 23:77 | >1.0 × 10$^{12}$ |
| Example 8 | siloxane polymer A | thermal base generator | titan black A | 23:77 | >1.0 × 10$^{12}$ |
| Example 9 | siloxane polymer B | thermal base generator | carbon black A | 17:83 | >1.0 × 10$^{12}$ |
| Example 10 | siloxane polymer C | thermal base generator | carbon black A | 23:77 | >1.0 × 10$^{12}$ |
| Example 11 | siloxane polymer D | thermal base generator | carbon black A | 23:77 | >1.0 × 10$^{12}$ |
| Comparative Example 1 | acrylic resin | none | carbon black A | 23:77 | <1.0 × 10$^{5}$ (off-scale low) |
| Comparative Example 2 | siloxane polymer A | none | carbon black A | 23:77 | 1.0 × 10$^{7}$ |

In the table,
thermal base generator: 1,8-diazabicyclo(5,4,0)-undecene-7-orthophthalate, manufactured by Sun-Apro Ltd.,
thermal acid generator: SI-100, manufactured by Sanshin Chemical Industry Co. Ltd.,
photoacid generator: NAI 105, manufactured by Midori Kagaku Co., Ltd.,
photobase generator: WPBG-140, manufactured by Wako Pure Chemical Industries, Ltd., and
acrylic resin: a product prepared by mixing acrylic resin PB-123 (trade name, manufactured by Mitsubishi Rayon Co., Ltd.) with epoxy crosslinking agent 3101L (trade name, manufactured by Printech Corporation) at a solid content mass ratio of 70:30.

The invention claimed is:

1. A composition for a black matrix comprising
(I) a siloxane polymer having a repeating unit represented by the following general formulae (Ia) and/or (Ib):

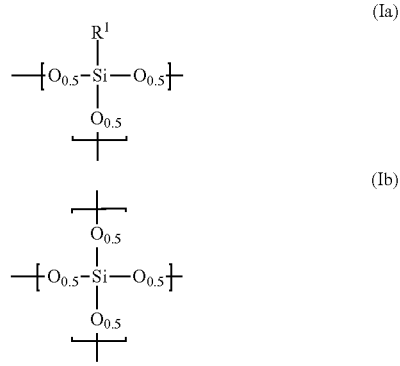

wherein,
R$^1$ represents hydrogen, a monovalent to trivalent, linear, branched or cyclic, saturated or unsaturated C$_{1-30}$ aliphatic hydrocarbyl, or a monovalent to trivalent C$_{6-30}$ aromatic hydrocarbyl,
in said aliphatic hydrocarbyl and said aromatic hydrocarbyl, one or more methylenes are substituted by oxy, imide or carbonyl, or unsubstituted;
one or more hydrogens are substituted by fluorine, hydroxy or alkoxy, or unsubstituted; or one or more carbons are substituted by silicon, or unsubstituted,
when R$^1$ is divalent or trivalent, R$^1$ connects silicons contained in a plurality of repeating units,
here, the ratio x in all the repeating units of the general formula (Ia) is 50 mol % to 100 mol %, and the ratio y in all the repeating units of the general formula (Ib) is 0 mol % to 50 mol %,
(II) a silanol condensation catalyst which is selected from the group consisting of a thermal base generator, and a thermal acid generator,
(III) a black colorant, and
(IV) a solvent and
the ratio Mw/Mn of the mass average molecular weight (Mw) to the number average molecular weight (Mn) in terms of styrene is 2.5 or less.

2. The composition for a black matrix according to claim 1, wherein a repeating unit of said general formula (Ia) in which R$^1$ is a phenyl is comprised, and said x is 50 mol % to 95 mol %.

3. The composition for a black matrix according to claim 2, wherein the mass ratio of said black colorant to said siloxane polymer is in the range of the black colorant: the siloxane polymer=10:90 to 70:30.

4. The composition for a black matrix according to claim 3, wherein the mass average molecular weight of the siloxane polymer is 200 to 10,000, and the ratio Mw/Mn of the mass average molecular weight (Mw) to the number average molecular weight (Mn) in terms of styrene is 2.5 or less.

5. A method for producing a black matrix, comprising applying the composition according to claim 4 onto a substrate to form a coating film, and curing said coating film.

6. The composition for a black matrix according to claim 1, wherein said silanol condensation catalyst is non-photosentive and is a thermal acid generator.

7. The composition for a black matrix according to claim 6, wherein either boiling point of, decomposition temperature of or sublimation temperature of the acid generated from said silanol condensation catalyst is 300° C. or lower.

8. The composition for a black matrix according to claim 1, wherein the mass ratio of said black colorant to said siloxane polymer is in the range of the black colorant: the siloxane polymer=10:90 to 70:30.

9. The composition for a black matrix according to claim 1, wherein the mass average molecular weight of the siloxane polymer is 200 to 10,000.

10. A method for producing a black matrix, comprising applying the composition according to claim 1 onto a substrate to form a coating film, and curing said coating film.

11. A method for producing a black matrix composite, comprising coating the black matrix produced by the method according to claim 10 with a layer, wherein said layer is formed by applying and curing a composition comprising a siloxane polymer having a repeating unit represented by the general formulae (Ia) and/or (Ib).

12. A method for manufacturing a display device, comprising applying the composition according to claim 1 onto a substrate to form a coating film, and curing the coating film to form a black matrix.

13. The composition for a black matrix according to claim 1, wherein said silanol condensation catalyst is non-photosentive and is a thermal base generator.

14. A composition for a black matrix comprising
(I) a siloxane polymer having a repeating unit represented by the following general formulae (Ia) and/or (Ib):

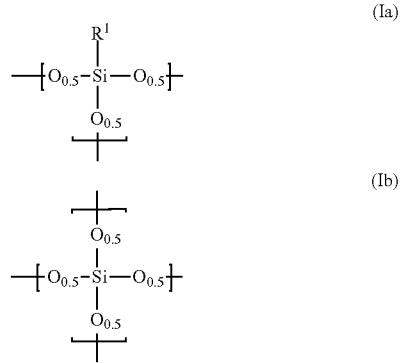

wherein,
R$^1$ represents hydrogen, a monovalent to trivalent, linear, branched or cyclic, saturated or unsaturated C$_{1-30}$ aliphatic hydrocarbyl, or a monovalent to trivalent C$_{6-30}$ aromatic hydrocarbyl,
in said aliphatic hydrocarbyl and said aromatic hydrocarbyl, one or more methylenes are substituted by oxy, imide or carbonyl, or unsubstituted;
one or more hydrogens are substituted by fluorine, hydroxy or alkoxy, or unsubstituted; or one or more carbons are substituted by silicon, or unsubstituted,
when R$^1$ is divalent or trivalent, R$^1$ connects silicons contained in a plurality of repeating units,
here, the ratio x in all the repeating units of the general formula (Ia) is 50 mol % to 100 mol %, and the ratio y in all the repeating units of the general formula (Ib) is 0 mol % to 50 mol %, (II) a silanol condensation catalyst which is a thermal base generator or thermal acid generator,
(III) a black colorant, and
(IV) a solvent and the siloxane polymer having a linear structure is 30 mol % or less of the total siloxane polymer and the ratio Mw/Mn of the mass average molecular weight (Mw) to the number average molecular weight (Mn) in terms of styrene is 2.5 or less.

15. The composition for a black matrix according to claim 14, wherein a repeating unit of said general formula (Ia) in which R$^1$ is a phenyl is comprised, and said x is 50 mol % to 95 mol %.

16. The composition for a black matrix according to claim 14, wherein the mass ratio of said black colorant to said siloxane polymer is in the range of the black colorant: the siloxane polymer=10:90 to 70:30.

17. The composition for a black matrix according to claim 14, wherein the mass average molecular weight of the siloxane polymer is 200 to 10,000.

18. A method for producing a black matrix, comprising applying the composition according to claim 14 onto a substrate to form a coating film, and curing said coating film.

19. A method for producing a black matrix composite, comprising coating the black matrix produced by the method according to claim 18 with a layer, wherein said layer is formed by applying and curing a composition comprising a siloxane polymer having a repeating unit represented by the general formulae (Ia) and/or (Ib).

20. A method for manufacturing a display device, comprising applying the composition according to claim 14 onto a substrate to form a coating film, and curing the coating film to form a black matrix.

21. The composition for a black matrix according to claim 14, wherein said silanol condensation catalyst is a thermal base generator.

22. The composition for a black matrix according to claim 21, wherein either boiling point of, decomposition temperature of or sublimation temperature of the acid generated from said silanol condensation catalyst is 300° C. or lower.

23. A composition for a black matrix comprising
(I) a siloxane polymer having a repeating unit represented by the following general formulae (Ia) and/or (Ib):

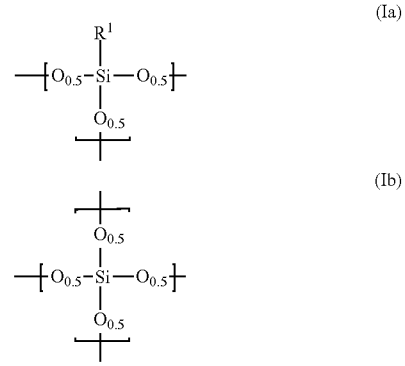

wherein,
R$^1$ represents hydrogen, a monovalent to trivalent, linear, branched or cyclic, saturated or unsaturated C$_{1-30}$ aliphatic hydrocarbyl, or a monovalent to trivalent C$_{6-30}$ aromatic hydrocarbyl,
in said aliphatic hydrocarbyl and said aromatic hydrocarbyl, one or more methylenes are substituted by oxy, imide or carbonyl, or unsubstituted;

one or more hydrogens are substituted by fluorine, hydroxy or alkoxy, or unsubstituted; or one or more carbons are substituted by silicon, or unsubstituted, when $R^1$ is divalent or trivalent, $R^1$ connects silicons contained in a plurality of repeating units, here, the ratio x in all the repeating units of the general formula (Ia) is 50 mol % to 100 mol %, and the ratio y in all the repeating units of the general formula (Ib) is 0 mol % to 50 mol %, (II) a silanol condensation catalyst which is a thermal base generator, (III) a black colorant, and (IV) a solvent, and the ratio Mw/Mn of the mass average molecular weight (Mw) to the number average molecular weight (Mn) in terms of styrene is 2.5 or less, and wherein the mass ratio of said black colorant to said siloxane polymer is in the range of the black colorant: the siloxane polymer=10:90 to 70:30.

* * * * *